United States Patent
Matsuo et al.

(10) Patent No.: US 10,923,609 B2
(45) Date of Patent: *Feb. 16, 2021

(54) SOLAR CELL MODULE

(71) Applicant: ZEON CORPORATION, Tokyo (JP)

(72) Inventors: Takatoshi Matsuo, Tokyo (JP); Yuki Hayashi, Tokyo (JP); Midori Yamaai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 52 days.

This patent is subject to a terminal disclaimer.

(21) Appl. No.: 16/326,554

(22) PCT Filed: Aug. 4, 2017

(86) PCT No.: PCT/JP2017/028475
§ 371 (c)(1),
(2) Date: Feb. 19, 2019

(87) PCT Pub. No.: WO2018/047550
PCT Pub. Date: Mar. 15, 2018

(65) Prior Publication Data
US 2019/0214512 A1 Jul. 11, 2019

(30) Foreign Application Priority Data
Sep. 6, 2016 (JP) ................. 2016-173933

(51) Int. Cl.
H01L 31/0224 (2006.01)
H01L 31/0216 (2014.01)
(Continued)

(52) U.S. Cl.
CPC ....... *H01L 31/022425* (2013.01); *H01G 9/20* (2013.01); *H01L 31/02167* (2013.01);
(Continued)

(58) Field of Classification Search
CPC ....... H01L 31/022425; H01L 31/02167; H01L 31/048; H01L 31/0508; H01G 9/20
See application file for complete search history.

(56) References Cited

U.S. PATENT DOCUMENTS

| 6,413,645 B1 | 7/2002 | Graff et al. |
| 2004/0046497 A1 | 3/2004 | Schaepkens et al. |

(Continued)

FOREIGN PATENT DOCUMENTS

| CN | 101606275 A | 12/2009 |
| CN | 102891019 A | 1/2013 |

(Continued)

OTHER PUBLICATIONS

Apr. 7, 2020, the Extended European Search Report issued by the European Patent Office in the corresponding European Patent Application No. 17848494.5.
(Continued)

*Primary Examiner* — Jayne L Mershon
(74) *Attorney, Agent, or Firm* — Kenja IP Law PC

(57) ABSTRACT

A solar cell module (100) includes: a barrier packaging material (13A, 13B) that is sealed by a seal (14) and encloses a connected body including one or more cells; and lead-out electrodes (11A, 11B). The solar cell module (100) includes a gap between the barrier packaging material and a periphery of the connected body in a base plate surface direction. A filling member (30) is present in at least part of the gap.

8 Claims, 5 Drawing Sheets

(51) Int. Cl.
*H01L 31/05* (2014.01)
*H01L 31/048* (2014.01)
*H01G 9/20* (2006.01)

(52) U.S. Cl.
CPC ........ *H01L 31/048* (2013.01); *H01L 31/0508* (2013.01); *Y02E 10/542* (2013.01)

(56) References Cited

U.S. PATENT DOCUMENTS

| | | | |
|---|---|---|---|
| 2004/0058157 A1 | 3/2004 | Ishikawa | |
| 2006/0226517 A1 | 10/2006 | Iwanaga et al. | |
| 2007/0125420 A1 | 6/2007 | Ezure et al. | |
| 2008/0318049 A1 | 12/2008 | Hata et al. | |
| 2010/0132785 A1 | 6/2010 | Morooka et al. | |
| 2011/0120550 A1* | 5/2011 | Okada | H01G 9/2095 136/256 |
| 2013/0019947 A1 | 1/2013 | Ejima et al. | |
| 2015/0228916 A1* | 8/2015 | Bulovic | H01L 51/003 136/259 |

FOREIGN PATENT DOCUMENTS

| | | |
|---|---|---|
| JP | S5312953 B2 | 5/1978 |
| JP | S58217344 A | 12/1983 |
| JP | 2000323273 A | 11/2000 |
| JP | 2001205743 A | 7/2001 |
| JP | 2003206361 A | 7/2003 |
| JP | 2004025732 A | 1/2004 |
| JP | 2004119306 A | 4/2004 |
| JP | 2006263989 A | 10/2006 |
| JP | 2007030387 A | 2/2007 |
| WO | 2006011655 A1 | 2/2006 |
| WO | 2009144899 A1 | 12/2009 |

OTHER PUBLICATIONS

Mar. 12, 2019, International Preliminary Report on Patentability issued in the International Patent Application No. PCT/JP2017/028475.
J.D.Affinito et al., A new method for fabricating transparent barrier layers, Thin Solid Films, 1996, pp. 63-67, vol. 290-291.
Oct. 24, 2017, International Search Report issued in the International Patent Application No. PCT/JP2017/028475.

* cited by examiner

SOLAR CELL MODULE

TECHNICAL FIELD

The present disclosure relates to a solar cell module.

BACKGROUND

In recent years, solar cells have been attracting interest as photoelectric conversion elements that convert light energy to electrical power. Among solar cells, those in which resin films are used as substrates benefit from having light weight and flexibility. Examples of solar cells in which resin films are used as substrates include dye-sensitized solar cells, organic thin-film solar cells, and perovskite solar cells. These solar cells normally have a cell structure in which a functional layer that contributes to electron or hole transfer is sandwiched between two electrodes. More specifically, in the case of a dye-sensitized solar cell, the solar cell includes an electrolyte layer as a functional layer. Moreover, in the case of an organic thin-film solar cell or a perovskite solar cell, the solar cell includes a donor layer and an acceptor layer as functional layers.

A solar cell is normally used in the form of a solar cell module that includes one or more cells and lead-out electrodes that are respectively connected to two electrodes, or in the form of a solar cell array in which multiple solar cell modules are connected in series or parallel.

In regards to dye-sensitized solar cells, it has been proposed that a resin may be used to protect the entirety of a solar cell module in order to prevent leakage of electrolyte solution from the solar cell module and infiltration of moisture from the outside, and thereby improve long-term stability of the solar cell module (for example, refer to PTL 1). PTL 1 describes vacuum lamination of the entirety of a dye-sensitized solar cell module using a fluorine-containing resin film as a barrier packaging material for protecting the module from the external environment.

CITATION LIST

Patent Literature

PTL 1: JP 2004-119306 A

SUMMARY

Technical Problem

There is demand for improving the long-term stability of solar cell modules. However, when a solar cell module has been packaged by vacuum lamination with a fluorine-containing resin film such as described in PTL 1, it has not been possible to prevent the formation of an air-containing space between the resin film and a lead-out electrode part at the end of a base plate, outside of the cells. There has been concern that, as a consequence, air inside this space may expand due to fluctuations in ambient temperature, for example, and this may cause inadequate sealing of the solar cell module. When a solar cell module having inadequate sealing is used in an actual installation environment, photoelectric conversion efficiency of the solar cell module gradually deteriorates, the photoelectric conversion efficiency retention rate (hereinafter also referred to simply as "efficiency retention") decreases, and long-term stability cannot be sufficiently improved.

Accordingly, an objective of the present disclosure is to provide a solar cell module that includes a barrier packaging material protecting the solar cell module from fluctuations in the external environment and that has an excellent photoelectric conversion efficiency retention rate.

Solution to Problem

The present disclosure aims to advantageously solve the problems set forth above by disclosing a solar cell module comprising: a connected body including one or more photoelectric conversion cells in which a first electrode at a side of a first base plate and a second electrode at a side of a second base plate are in opposition via a functional layer; at least one barrier packaging material that is sealed by a seal and encloses the connected body; a first lead-out electrode connected to the first electrode via a first electrical connector; and a second lead-out electrode connected to the second electrode via a second electrical connector, wherein the solar cell module includes a gap between the barrier packaging material and a periphery of the connected body in a base plate surface direction that includes a surface direction of the first base plate and a surface direction of the second base plate, and a filling member is present in at least part of the gap. A solar cell module having a high photoelectric conversion efficiency retention rate can be obtained as a result of the filling member being present in at least part of a gap between the connected body and the barrier packaging material in the base plate surface direction in this manner.

In the presently disclosed solar cell module, the filling member preferably includes a cured resin composition. The inclusion of a cured resin composition in the filling member enables airtight sealing of the solar cell module.

In the presently disclosed solar cell module, at least part of the seal is preferably unified with the filling member. When at least part of the seal is unified with the filling member, airtightness of sealing of the solar cell module can be improved, and efficiency retention of the solar cell module can be further improved.

In the presently disclosed solar cell module, the filling member may include a frame-like shaped product having an inner surface shape that at least partly extends along a side surface of the connected body.

The term "frame-like" as used in the present specification refers to a shape that includes at least an outer border and an inner border. The shape of the outer border or inner border is not specifically limited and may, for example, be a rectangular shape, a polygonal shape, a circular shape, an elliptical shape, or any other shape.

The inclusion of a frame-like shaped product in the filling member makes it more difficult for bending to occur around the seal and is, therefore, expected to have an effect of suppressing generation of stress and increasing resistance of the barrier packaging material to peeling compared to a case in which a frame-like shaped product is not included. Moreover, by matching the thickness of the frame-like shaped product with the thickness of the solar cell module, ease of handling in a subsequent step, such as when combining the solar cell module with another member, can be improved because there is no step between a region in the solar cell module corresponding to the seal of the barrier packaging material and other regions in the solar cell module.

In the presently disclosed solar cell module, the frame-like shaped product is preferably unified with part of the barrier packaging material. Unification of the frame-like shaped product with part of the barrier packaging material can improve processability in a packaging step of the solar cell module. Moreover, unification of the frame-like shaped product with part of the barrier packaging material can further improve tight sealing of the solar cell module and further increase efficiency retention of the solar cell module.

In the presently disclosed solar cell module, it is preferable that the frame-like shaped product includes at least one conductor or partial conductive layer that functions as the first lead-out electrode or the second lead-out electrode, and at least part of the conductor or partial conductive layer is not covered by the barrier packaging material. When a frame-like shaped product that can function as a lead-out electrode is used, the solar cell module can be efficiently produced and the lead-out electrode can be positioned at any surface of the frame-like shaped product, such as at a bottom surface side of the solar cell module.

In the presently disclosed solar cell module, the conductive layer is preferably a conductive layer that is formed on the frame-like shaped product through surface treatment using a conductive material. When the frame-like shaped product includes a conductive layer formed through surface treatment, tight sealing and efficiency retention of the obtained solar cell module can be further improved.

The presently disclosed solar cell module preferably further comprises an adhesive layer disposed in at least part of a gap between the barrier packaging material and either or both of the first base plate and the second base plate. Sealing and efficiency retention of the solar cell module can be further improved when an adhesive layer is interposed between the barrier packaging material and each of the base plates. Moreover, reflection can be suppressed and light transmission into the module can be improved by selecting a material in consideration of the relationship with the refractive index of a substrate.

In the presently disclosed solar cell module, the functional layer may be an electrolyte layer and the solar cell module may be a dye-sensitized solar cell module.

Advantageous Effect

According to the present disclosure, it is possible to provide a solar cell module having high efficiency retention.

DETAILED DESCRIPTION

The following provides a detailed description of embodiments of the present disclosure based on the drawings. The presently disclosed solar cell module may, without any specific limitations, be a dye-sensitized solar cell module, an organic thin-film solar cell module, a perovskite solar cell module, or the like. Moreover, the presently disclosed solar cell module may be a solar cell module that includes a plurality of photoelectric conversion cells (hereinafter also referred to simply as "cells") in series connection and may, for example, be a solar cell module having a Z-type integrated structure. Examples of possible integrated structures of the solar cell module besides that of a Z-type module include a series connection structure such as that of a W-type module or a monolithic module, and a parallel connection structure, but are not specifically limited thereto.

Figure 1:
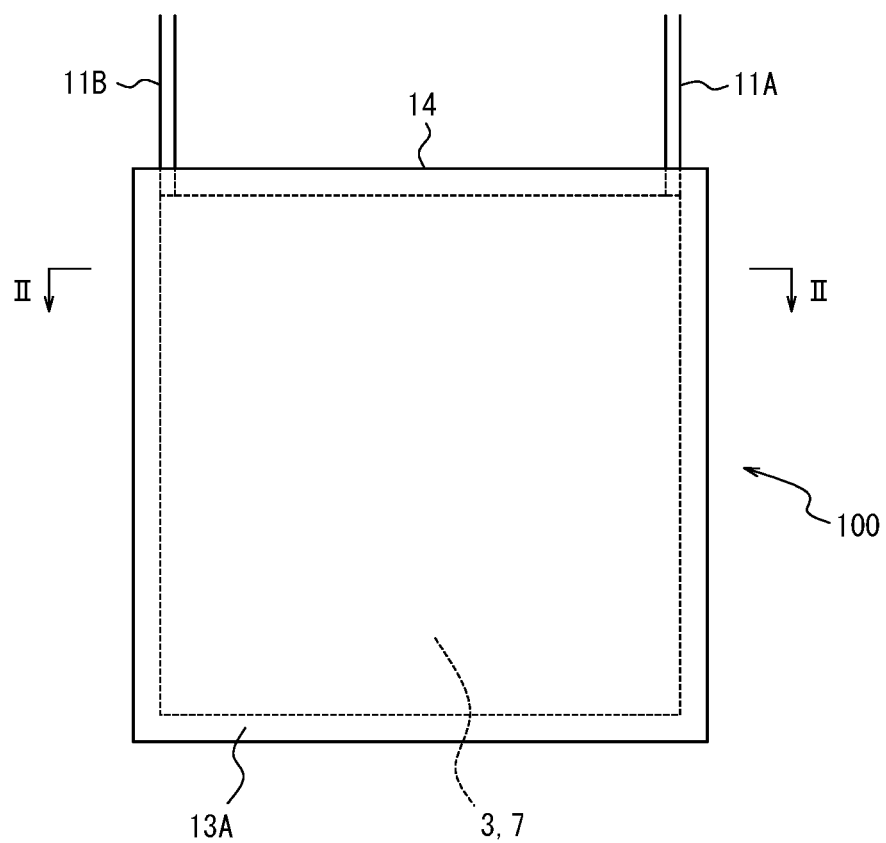
FIG. 1 is a plan view illustrating one example of schematic structure of a solar cell module according to one embodiment of the present disclosure.
Figure 2:
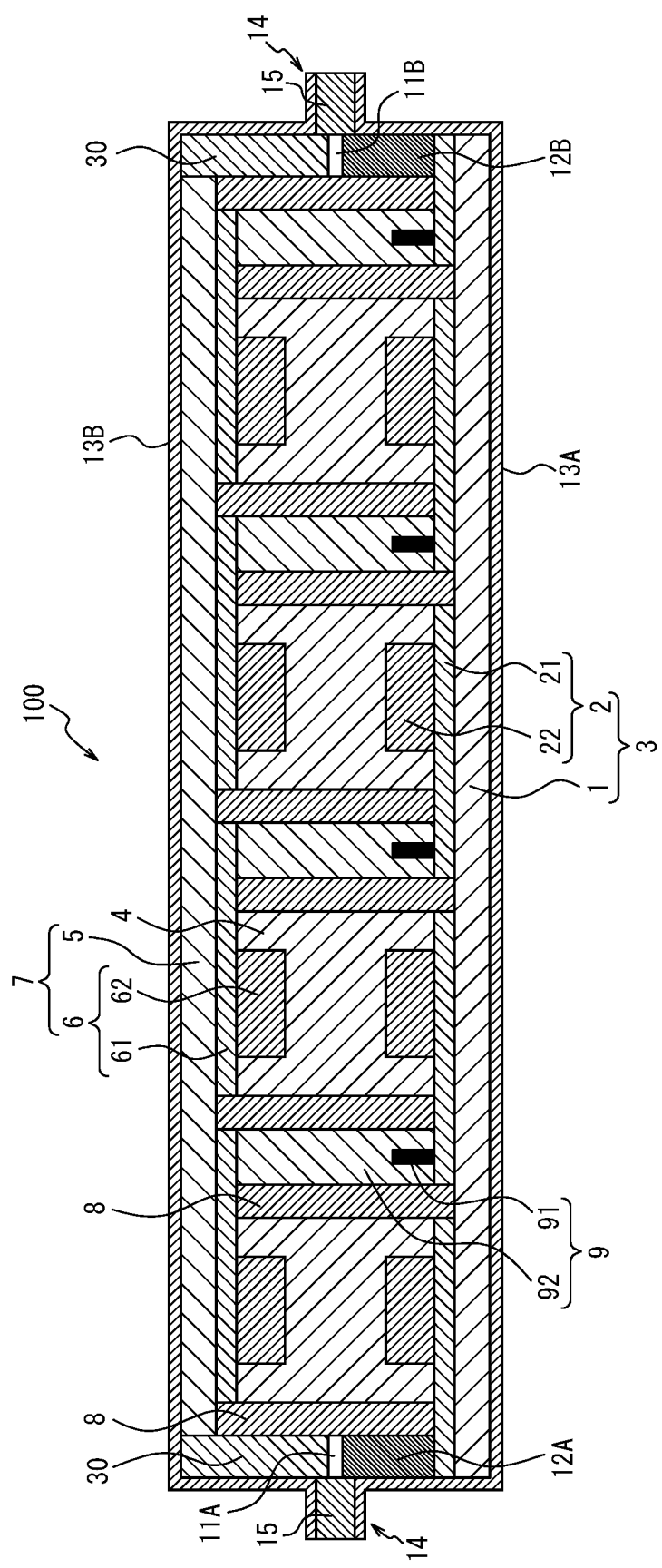
FIG. 2 is a cross-sectional view II-II illustrating one example of schematic structure of the solar cell module illustrated in FIG. 1.

Moreover, examples of a dye-sensitized solar cell module having a Z-type integrated structure that is one example of the present disclosure include, but are not specifically limited to, a solar cell module 100 such as illustrated by the plan view in FIG. 1 and the thickness direction cross-sectional view in FIG. 2.

The solar cell module 100 illustrated in the plan view of FIG. 1 includes a barrier packaging material 13A and a barrier packaging material 13B (not illustrated in FIG. 1) that enclose a first base plate 3 (photoelectrode base plate) and a second base plate 7 (counter electrode base plate) that form a connected body of a plurality of cells, and also includes a seal 14 that seals the barrier packaging material 13A and the barrier packaging material 13B.

FIG. 2 is a cross-sectional view along a cutting line II-II in FIG. 1. As clearly illustrated in FIG. 2, the solar cell module 100 is a dye-sensitized solar cell module including a connected body of a plurality of cells (four in the illustrated example) that are defined by partitions 8 and are connected in series, and has what is referred to as a "Z-type integrated structure". The solar cell module 100 has a structure in which the first base plate 3 including a first substrate 1 and a plurality of photoelectrodes (first electrodes) 2 (four in the illustrated example) disposed on the first substrate 1 with separation between the individual photoelectrodes 2 and the second base plate 7 including a second substrate 5 and a plurality of counter electrodes (second electrodes) 6 (four in the illustrated example) disposed on the second substrate 5 with separation between the individual counter electrodes 6 are pasted together in a state with the partitions 8 interposed between the first base plate 3 and the second base plate 7 such that the photoelectrode 2 and the counter electrode 6 of each cell are in opposition via an electrolyte layer (functional layer) 4 (i.e., such that a cell is formed) and such that a cell connector 9 electrically connects the photoelectrode 2 of one cell and the counter electrode 6 of another cell among adjacent cells. Each cell of the solar cell module 100 includes a photoelectrode 2, a counter electrode 6 in opposition to the photoelectrode 2, and an electrolyte layer 4 disposed between the photoelectrode 2 and the counter electrode 6.

The solar cell module 100 also includes a first lead-out electrode 11A that is connected to a photoelectrode conductive layer 21 of a photoelectrode 2 via a first electrical connector 12A, and a second lead-out electrode 11B that is connected to a counter electrode conductive layer 61 of a counter electrode 6 via a second electrical connector 12B. The barrier packaging materials 13A and 13B are sealed by a seal 14 formed through sealing with a cured seal resin composition 15. As clearly illustrated in FIG. 1, the seal 14 surrounds the periphery of the solar cell module 100 and separates the solar cell module 100 and the external environment. In this manner, the connected body of the plurality of cells described above is enclosed in an internal space enclosed by the barrier packaging materials 13A and 13B that are sealed by the seal 14. Consequently, in the internal space of the solar cell module 100, a gap is present between the barrier packaging material 13B and the periphery of the connected body in a base plate surface direction including a surface direction of the first base plate 3 and a surface direction of the second base plate 7. In other words, a step that may be defined by the periphery of the connected body (defined by a side surface of a partition 8 and an end surface of the second substrate 5 in FIG. 2) and the first lead-out electrode 11A or the second lead-out electrode 11B is present inside the solar cell module 100. If a space in contact with this step and the barrier packaging material 13B is mainly filled by a gas, expansion of the gas when the temperature of the solar cell module 100 rises may cause peeling of the barrier packaging material 13A and/or the barrier packaging material 13B at the seal 14. Accordingly, by providing a filling member 30 in at least part of the gap between the barrier packaging material 13B and the periphery of the connected body in the base plate surface direction in the presently disclosed solar cell module, the amount of gas contained in the gap can be reduced, and peeling at the seal 14 can be inhibited. Moreover, since the filling member can ease strain arising when the barrier packaging material is adhered around the step, peeling can be more effectively inhibited.

It should be noted that the structure of the presently disclosed solar cell module is not limited to the structure illustrated in FIGS. 1 and 2. For example, although the first lead-out electrode 11A and the second lead-out electrode 11B extend from the same edge of the seal 14 formed at the periphery of the solar cell module 100 as illustrated in FIG. 1, the solar cell module 100 may alternatively have a structure in which the first lead-out electrode 11A and the second lead-out electrode 11B extend from different edges of the seal 14. Moreover, the first lead-out electrode 11A and the second lead-out electrode 11B are both disposed roughly centrally in the thickness direction of the solar cell module 100 in FIG. 2. However, the first lead-out electrode 11A is not specifically limited so long as the first lead-out electrode 11A is electrically connected to a photoelectrode 2 and insulated from the counter electrodes 6, and may be disposed at a position that is closer to the second substrate 5 than to the first substrate 1. Conversely, the second lead-out electrode 11B may be disposed at a position that is closer to the first substrate 1 than to the second substrate 5.

<Photoelectrode Base Plate>

The first base plate 3 of the solar cell module 100 illustrated in FIGS. 1 and 2 includes a first substrate 1 and a plurality of photoelectrodes 2 that is disposed on the first substrate 1 with separation between the individual photoelectrodes 2. The photoelectrodes 2 each include a photoelectrode conductive layer 21 disposed on the first substrate 1 and a porous semiconductor fine particulate layer 22 disposed on part of the photoelectrode conductive layer 21. Note that photoelectrode conductive layers 21 are disposed with gaps therebetween. Moreover, adjacent photoelectrodes 2 are disposed such as to be electrically insulated from one another. This electrical insulation may be achieved, for example, through partitions 8 that are present in the gaps between adjacent photoelectrode conductive layers 21, but is not specifically limited to being achieved in this manner.

A substrate used as the first substrate 1 may be selected as appropriate from commonly known light-transmitting substrates without any specific limitations. For example, a known transparent substrate that has transparency in the visible region, such as a transparent resin or glass, may be used as the first substrate 1. Of such substrates, a transparent resin that has been shaped into the form of a film (i.e., a resin film) is preferable as the first substrate 1. Although barrier performance of a substrate itself is poorer with a resin film than with substrates such as glass, barrier performance can be significantly improved through adoption of the presently disclosed structure. Moreover, the adoption of a resin film as the first substrate 1 can provide the solar cell module with weight-reduction and flexibility, and thereby enable use of the solar cell module in various applications.

Examples of transparent resins that may be used to form a resin film include synthetic resins such as polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyester sulfone (PES), polyetherimide (PEI), transparent polyimide (PI), and cycloolefin polymer (COP).

The photoelectrode conductive layer 21 is not specifically limited and may be obtained by forming a conductive layer composed of a metal mesh containing Au, Ag, Cu, or the like, a conductive layer formed through application of metal nanoparticles such as Ag nanoparticles, fine Ag wire, or the like, a conductive layer containing a composite metal oxide such as indium tin oxide (ITO), indium zinc oxide (IZO), or fluorine-doped tin oxide (FTO), a carbon-based conductive layer containing carbon nanotubes, graphene, or the like, or a conductive layer containing a conductive polymer such as PEDOT/PSS (poly(3,4-ethylenedioxythiophene) polystyrene sulfonate). These materials may be selected as appropriate depending on compatibility with other materials and so forth. A plurality of such conductive layers may be stacked on a substrate. Alternatively, various conductive materials such as described above that can be used to form these conductive layers may be mixed and then used to form a single conductive layer.

The photoelectrode conductive layer 21 may be formed on the first substrate 1 by a known formation method such as a method using a combination of sputtering and etching or screen printing.

An undercoat layer (not illustrated) may optionally be disposed on the photoelectrode conductive layer 21. In a case in which the subsequently described electrolyte layer 4 is formed by a liquid, electrolyte solution may reach the photoelectrode conductive layer 21 through the porous semiconductor fine particulate layer 22, and an internal short-circuit phenomenon referred to as reverse electron transfer, in which electrons leak from the photoelectrode conductive layer 21 into the electrolyte layer 4, may occur. This may generate a reverse current that is unrelated to photoirradiation and reduce photoelectric conversion efficiency. The internal short-circuit phenomenon can be prevented by providing the undercoat layer on the photoelectrode conductive layer 21. Provision of the undercoat layer on the photoelectrode conductive layer 21 can also improve close adherence between the porous semiconductor fine particulate layer 22 and the photoelectrode conductive layer 21.

The undercoat layer is not specifically limited so long as it is a substance that can prevent the internal short-circuit phenomenon (substance for which an interface reaction does not readily occur). For example, the undercoat layer may be a layer containing a material such as titanium oxide, niobium oxide, or tungsten oxide. The undercoat layer may be formed by a method in which the aforementioned material is directly sputtered onto a transparent conductive layer or a method in which a solution obtained by dissolving the aforementioned material in a solvent, a solution obtained by dissolving a metal hydroxide that serves as a precursor of a metal oxide, or a solution containing a metal hydroxide obtained by dissolving an organometallic compound in a mixed solvent containing water is applied onto the photoelectrode conductive layer 21, dried, and then sintered as necessary.

The porous semiconductor fine particulate layer 22 on which a sensitizing dye is supported (adsorbed) is not specifically limited and may be a porous semiconductor fine particulate layer that is obtained through adsorption of a sensitizing dye such as an organic dye or a metal complex dye by a porous semiconductor fine particulate layer containing particles of an oxide semiconductor such as titanium oxide, zinc oxide, or tin oxide. Examples of organic dyes that may be used include cyanine dyes, merocyanine dyes, oxonol dyes, xanthene dyes, squarylium dyes, polymethine dyes, coumarin dyes, riboflavin dyes, and perylene dyes. Examples of metal complex dyes that may be used include, bipyridine complexes, phthalocyanine complexes, and porphyrin complexes of metals such as iron, copper, and ruthenium. Representative examples of sensitizing dyes include N3, N719, N749, D102, D131, D150, N205, HRS-1, and HRS-2. It is preferable that an organic solvent in which the sensitizing dye is dissolved is subjected to degassing and purification by distillation in advance in order to remove moisture and gas present in the solvent. Preferable examples of solvents that may be used as the organic solvent include alcohols such as methanol, ethanol, and propanol, nitriles such as acetonitrile, halogenated hydrocarbons, ethers, amides, esters, carbonate esters, ketones, hydrocarbons, aromatics, and nitromethane. Moreover, a mixture of two or more of these solvents may be used.

The porous semiconductor fine particulate layer 22 may be formed on the photoelectrode conductive layer 21 by a known formation method such as screen printing or coating. Moreover, adsorption of the sensitizing dye by the porous semiconductor fine particulate layer may be achieved by a known method such as immersion of the porous semiconductor fine particulate layer in a solution containing the sensitizing dye.

<Second Base Plate>

The second base plate 7 of the solar cell module 100 includes a second substrate 5 and a plurality of counter electrodes 6 that is disposed on the second substrate 5 with separation between the individual counter electrodes 6. The counter electrodes 6 each include a counter electrode conductive layer 61 disposed on the second substrate 5 and a catalyst layer 62 disposed on part of the counter electrode conductive layer 61. Note that counter electrode conductive layers 61 are disposed with gaps therebetween. The catalyst layer 62 is in opposition to the porous semiconductor fine particulate layer 22 of a photoelectrode 2.

Note that adjacent counter electrodes 6 are disposed such as to be electrically insulated from one another. This electrical insulation may be achieved, for example, through partitions 8 that are present in the gaps between adjacent counter electrodes 6, but is not specifically limited to being achieved in this manner.

The second substrate 5 may be the same type of substrate as the first substrate 1, or may be a substrate that is not transparent such as a foil or plate of titanium, SUS, aluminum, or the like, and that is not corroded by other solar cell members. Of these substrates, it is preferable that a resin film is used to form the second substrate 5 for the same reasons as for the first substrate 1.

The same type of conductive layer as for the photoelectrode conductive layer 21 may be used as the counter electrode conductive layer 61.

The catalyst layer 62 is not specifically limited and may be any catalyst layer containing a component that can function as a catalyst such as a conductive polymer, a carbon nanostructure, a precious metal, or a mixture of a carbon nanostructure and a precious metal.

Examples of conductive polymers that may be used include polythiophenes such as poly(thiophene-2,5-diyl), poly(3-butylthiophene-2,5-diyl), poly(3-hexylthiophene-2,5-diyl), and poly(2,3-dihydrothieno-[3,4-b]-1,4-dioxine) (PEDOT); polyacetylene and derivatives thereof; polyaniline and derivatives thereof; polypyrrole and derivatives thereof; and polyphenylene vinylenes such as poly(p-xylene tetrahydrothiophenium chloride), poly[(2-methoxy-5-(2'-ethylhexyloxy))-1,4-phenylenevinylene], poly[(2-methoxy-5-(3',7'-dimethyloctyloxy)-1,4-phenylenevinylene)], and poly[2-(2',5'-bis(2"-ethylhexyloxy)phenyl)-1,4-phenylenevinylene].

Examples of carbon nanostructures that may be used include natural graphite, activated carbon, artificial graphite, graphene, carbon nanotubes, and carbon nanobuds.

Any precious metal that has a catalytic effect may be used without any specific limitations. A commonly known precious metal such as platinum metal, palladium metal, or ruthenium metal may be selected for use as appropriate.

The catalyst layer may be formed by a commonly known method that is selected as appropriate without any specific limitations. For example, the catalyst layer may be formed by applying or spraying, onto a conductive film, a mixture that is obtained by dissolving or dispersing a conductive polymer, a carbon nanostructure, a precious metal, or both a carbon nanostructure and a precious metal in an appropriate solvent, and then drying the solvent of the mixture. In the case of a carbon nanostructure or a precious metal, the mixture may further contain a binder. The binder is preferably a polymer that includes a functional group such as a hydroxy group, a carboxyl group, a sulfonyl group, or a phosphate group, a sodium salt of these functional groups, or the like from a viewpoint of carbon nanostructure dispersibility and close adherence with a substrate. Moreover, a film may be produced by a known formation method such as screen printing, vapor deposition, or sputtering.

The catalyst layer may contain carbon nanotubes having an average diameter (Av) and a diameter standard deviation ($\sigma$) that satisfy $0.60 > 3\sigma/Av > 0.20$ (hereinafter also referred to as formula (A)). (Hereinafter, these carbon nanotubes are also referred to as "prescribed carbon nanotubes".) It should be noted that the term "prescribed carbon nanotubes" is used herein as a general term for collectively referring to specific carbon nanotubes composing the "prescribed carbon nanotubes" and the term "diameter" is used herein to refer to the external diameter of the specific carbon nanotubes.

The average diameter (Av) and the diameter standard deviation ($\sigma$) of the prescribed carbon nanotubes are respectively a sample average value and a sample standard deviation. These values are determined as an average value and a standard deviation when the diameters of 100 randomly selected carbon nanotubes are measured by observation under a transmission electron microscope. The term "$3\sigma$" in formula (A) is the obtained standard deviation ($\sigma$) multiplied by 3.

A counter electrode having excellent catalytic activity can be obtained through use of the prescribed carbon nanotubes. From a viewpoint of improving characteristics of the obtained counter electrode, it is preferable that $0.60 > 3\sigma/Av > 0.25$, and more preferable that $0.60 > 3\sigma/Av > 0.50$.

$3\sigma/Av$ expresses the diameter distribution of the prescribed carbon nanotubes and a larger value for $3\sigma/Av$ indicates a wider diameter distribution. The diameter distribution preferably takes a normal distribution. In this situation, the diameter distribution can be obtained by measuring the diameters of 100 randomly selected carbon nanotubes that can be observed using a transmission electron microscope, using the results to plot the obtained data with diameter on the horizontal axis and probability density on the vertical axis, and then making a Gaussian approximation. Although a large 3σ/Av value can be obtained by combining a plurality of types of carbon nanotubes obtained by different production methods, for example, it is difficult to obtain a normal distribution for the diameter distribution in such a situation. The prescribed carbon nanotubes may be a single type of carbon nanotubes or carbon nanotubes obtained by blending a single type of carbon nanotubes with an amount of other carbon nanotubes that does not affect the diameter distribution of the single type of carbon nanotubes.

The prescribed carbon nanotubes may be obtained by a commonly known method. For example, the prescribed carbon nanotubes may be obtained by a method (super growth method) in which, during synthesis of carbon nanotubes through chemical vapor deposition (CVD) by supplying a feedstock compound and a carrier gas onto a substrate (hereinafter also referred to as a "substrate for CNT production") having a catalyst layer for carbon nanotube production (hereinafter also referred to as a "catalyst layer for CNT production") at the surface thereof, a trace amount of an oxidizing agent is provided in the system to dramatically improve the catalytic activity of the catalyst layer for CNT production (for example, WO 2006/011655 A1). Hereinafter, carbon nanotubes produced by the super growth method are also referred to as SGCNTs.

A counter electrode including a catalyst layer having the prescribed carbon nanotubes as a constituent material can be produced by, for example, preparing a dispersion liquid containing the prescribed carbon nanotubes, applying the dispersion liquid onto a substrate, and drying the resultant applied film to form a catalyst layer.

The partitions 8 of the solar cell module 100 are disposed between the first base plate 3 and the second base plate 7 and surround each of the electrolyte layers 4 and the cell connectors 9. In other words, spaces for the electrolyte layers 4 and spaces for the cell connectors 9 are defined by the first base plate 3, the second base plate 7, and the partitions 8.

Specifically, in FIG. 2, at one side (left side in FIG. 2) of each cell in the width direction thereof, a partition 8 is disposed between the photoelectrode conductive layer 21 of the photoelectrode 2 of the first base plate 3 and the second substrate 5 of the second base plate 7 and, at the other side (right side in FIG. 2) of each cell in the width direction thereof, a partition 8 is disposed between the photoelectrode conductive layer 21 of the photoelectrode 2 of the first base plate 3 and the counter electrode conductive layer 61 (part positioned further to the other side in the width direction than a part where the catalyst layer 62 is formed) of the counter electrode 6 of the second base plate 7. The electrolyte layers 4 and the cell connectors 9 are disposed alternately between the partitions 8.

No specific limitations are placed on the partitions 8 so long as they can adhere the first base plate 3 and the second base plate 7 and can seal each of the electrolyte layers 4. It is preferable that the partitions 8 have excellent adhesiveness with the base plates, electrolyte resistance (chemical resistance), and durability under high temperature and high humidity (wet heat resistance). Examples of partition materials that may be used to form such partitions 8 include non-conductive thermoplastic resins, thermosetting resins, and active radiation (light, electron beam) curable resins. More specific examples include (meth)acrylic resins, fluororesins, silicone resins, olefinic resins, urethane resins, and polyamide resins. In the present specification, "(meth)acryl" is used to indicate "acryl" or "methacryl". Of these materials, a photocurable acrylic resin is preferable from a viewpoint of ease of handling.

Note that from a viewpoint of ease of production, it is of course possible to form the partitions 8 using films obtained by shaping various resins such as described above into a sheet-shaped form.

<Functional Layer>

Each electrolyte layer 4 serving as a functional layer in the solar cell module 100 is disposed in a space surrounded by a porous semiconductor fine particulate layer 22 of a photoelectrode 2, a catalyst layer 62 of a counter electrode 6, and partitions 8. The electrolyte layer 4 may be formed using any electrolyte solution, gel electrolyte, or solid electrolyte that can be used in a dye-sensitized solar cell without any specific limitations.

<Cell Connectors>

The cell connectors 9 of the solar cell module 100 electrically connect adjacent cells in series. Specifically, each of the cell connectors 9 electrically connects the photoelectrode conductive layer 21 of the photoelectrode 2 in a cell positioned on the right side in FIG. 2 to the counter electrode conductive layer 61 of the counter electrode 6 in a cell positioned on the left side in FIG. 2.

Each of the cell connectors 9 in the solar cell module 100 includes wiring 91 that is formed on the photoelectrode conductive layer 21 of the photoelectrode 2 and is separated from the porous semiconductor fine particulate layer 22, and a conductive resin composition 92 that is used to fill a space surrounded by the first base plate 3, the second base plate 7, and partitions 8. Note that although each of the cell connectors 9 in the solar cell module 100 illustrated in FIG. 2 is formed using wiring 91 and a conductive resin composition 92, a cell connector in the presently disclosed solar cell module may be formed using just a conductive resin composition. Also, wiring may be formed on the counter electrode conductive layer 61 of the counter electrode 6.

Wiring made from a material having conductivity such as a metal or a metal oxide may be used as the wiring 91 without any specific limitations. In particular, it is preferable to use metal wiring such as copper wiring, gold wiring, silver wiring, or aluminum wiring for the wiring 91 from a viewpoint of lowering resistance of the cell connectors 9 and increasing photoelectric conversion efficiency of the dye-sensitized solar cell module. The wiring 91 may be formed on the photoelectrode conductive layer 21 by a known formation method such as sputtering or screen printing.

The conductive resin composition 92 is preferably a composition that contains a resin and conductive particles, but is not specifically limited thereto. Examples of the resin of the conductive resin composition 92 include, but are not specifically limited to, (meth)acrylic resins; epoxy resins such as bisphenol-type epoxy resins, novolac-type epoxy resins, cyclic epoxy resins, and alicyclic epoxy resins; and silicone resins. Any curing agent such as a radical initiator, a cationic curing agent, or an anionic curing agent may be used in the resin. The form of polymerization of the resin is not specifically limited and may be addition polymerization, ring-opening polymerization, or the like. Moreover, a resin used as a partition material and a resin of the conductive resin composition 92 may be the same type or different types of resin.

Examples of the conductive particles of the conductive resin composition 92 include, but are not specifically limited to, particles of metals such as Ag, Au, Cu, Al, In, Sn, Bi, and Pb and oxides thereof; conductive carbon particles; and particles obtained by coating the surfaces of organic compound particles such as resin particles or inorganic compound particles with a conductive substance such as a metal (for example, Ag, Au, or Cu) or an oxide of such metals (for example, Au/Ni alloy coated particles).

The average particle diameter of the conductive particles is preferably at least 0.5 μm and not more than 30 μm. The percentage content of the conductive particles is preferably at least 0.1 volume % and not more than 90 volume %.

The cell connector 9 in which the conductive resin composition 92 described above is used may be formed, for example, by loading an uncured conductive resin composition containing an uncured resin and conductive particles at a position where the cell connector 9 is to be formed and then curing the uncured conductive resin composition that has been loaded, but is not specifically limited to being formed in this manner.

<Lead-Out Electrodes>

The first lead-out electrode 11A and the second lead-out electrode 11B that are respectively connected to a photoelectrode 2 and a counter electrode 6 are not specifically limited and may each include a conductor that is formed from a typical conductive material. The conductor may be a conductor formed from a metal material selected from the group consisting of copper, aluminum, nickel, titanium, iron, and the like, or an alloy material including any of these metal materials. Of these examples, an electrode having copper as a conductor or an electrode having stainless steel as a substrate is preferable.

The first electrical connector 12A that connects a photoelectrode conductive layer 21 of a photoelectrode 2 with the first lead-out electrode 11A and the second electrical connector 12B that connects a counter electrode conductive layer 61 of a counter electrode 6 with the second lead-out electrode 11B are not specifically limited and may be formed from a typical electrical connection material such as a conductive resin composition or solder. A known composition that contains a material having conductivity such as a metal, a metal oxide, or a conductive carbon material and any resin may be used as the conductive resin composition in the same way as the previously described conductive resin composition 92. Solder that contains tin, silver, copper, bismuth, lead, a flux component, or the like may be used as the solder.

Note that although not illustrated in FIG. 2, the first electrical connector 12A and the second electrical connector 12B may each be connected to a photoelectrode 2 or counter electrode 6 via current collector wiring formed in the same manner as the wiring 91.

<Seal>

The seal 14 is sealed by a cured seal resin composition 15. Examples of the seal resin composition include, but are not specifically limited to, photocurable resin compositions, thermosetting resin compositions, and thermoplastic resin compositions. Of these compositions, photocurable resin compositions are preferable as the seal resin composition. When the seal resin composition is photocurable, degradation due to heating during production can be prevented, particularly in production of an organic solar cell, and electrical characteristics of the solar cell module can be improved. Moreover, it is expected that a solar cell module having good production efficiency will be obtained because a photocurable resin can be cured in a short time.

Examples of photocurable resin compositions that may be used include ultraviolet curable resin compositions and visible light curable resin compositions, with ultraviolet curable resin compositions being preferable. Specific examples of ultraviolet curable resin compositions that may be used include (meth)acrylic resin compositions, epoxy resin compositions, fluororesin compositions, and olefinic resin compositions. Of these ultraviolet curable resin compositions, the use of an acrylic resin composition, an epoxy resin composition, or a fluororesin composition is preferable. One of these resin compositions may be used individually, or two or more of these resin compositions may be used as a mixture.

Examples of thermosetting resin compositions that may be used include thermosetting resin compositions that can be cured at a temperature that does not cause vaporization of the electrolyte contained in the electrolyte layers 4. More specifically, thermosetting resin compositions having a curing temperature within a range of 60° C. to 200° C., preferably within a range of 80° C. to 180° C., and more preferably within a range of 100° C. to 160° C. may be used. Specific examples of thermosetting resin compositions that may be used include (meth)acrylic resin compositions, epoxy resin compositions, fluororesin compositions, silicone resin compositions, olefinic resin compositions, and polyisobutylene resin compositions. One of these resin compositions may be used individually, or two or more of these resin compositions may be used as a mixture.

Examples of thermoplastic resin compositions that may be used include thermoplastic resins having a melting point at a temperature that does not cause vaporization of liquid in the electrolyte layers. More specifically, thermoplastic resins having a melting point within a range of 80° C. to 250° C., and preferably within a range of 100° C. to 200° C. may be used. Specific examples of thermoplastic resins that may be used include olefinic resins, polyisobutylene resins, silicone resins, (meth)acrylic resins, and polyamide resins. One of these resins may be used individually, or two or more of these resins may be used as a mixture.

Moreover, the seal 14 may be composed of a plurality of members that are made from the same material or different materials. For example, the seal 14 may include a seal member that is made from a metal or resin and a cured seal resin composition that adheres the seal member to the upper and lower barrier packaging materials 13A and 13B.

<Barrier Packaging Materials>

The barrier packaging materials 13A and 13B provide the solar cell module 100 with durability under high temperature and high humidity environmental conditions to which the solar cell module 100 may be exposed. Accordingly, the barrier packaging materials 13A and 13B are preferably packaging that acts as a barrier against gases and water vapor. In FIG. 2, two barrier packaging materials 13A and 13B are illustrated as the barrier packaging material. The barrier packaging material 13A is disposed at the side of the first base plate 3 and the barrier packaging material 13B is disposed at the side of the second base plate 7 as clearly illustrated in FIG. 2. However, the barrier packaging material is not limited to being packaging in the form of two sheets that are disposed at the top and bottom of the solar cell module in the thickness direction as illustrated in FIG. 2, and may be in a thin plate form, or may be a tubular film that is open in a depth direction (left/right direction in FIG. 2) of the plurality of cells included in the solar cell module.

No specific limitations are placed on the form in which the first base plate 3 and the second base plate 7 are enclosed by the barrier packaging materials 13A and 13B. For example, the first base plate 3/second base plate 7 and the barrier packaging material 13A/13B may be in a closely adhered state via an adhesive. Alternatively, the barrier packaging material 13A/13B may enclose the first base plate 3/second base plate 7 with a space therebetween, and this space may be filled with a filler or the like through which water vapor and gases do not easily pass. More specifically, the barrier packaging material 13A disposed at the side of the first base plate 3 and the first base plate 3 may be in a closely adhered state via an adhesive layer (not illustrated) and the barrier packaging material 13B disposed at the side of the second base plate 7 and the second base plate 7 may be in a closely adhered state via an adhesive layer (not illustrated). Tight sealing of the solar cell module can be further improved through the inclusion of an adhesive layer. In particular, in a case in which an adhesive layer is disposed at the side of the first base plate 3 (base plate at photoirradiation side), the presence of the adhesive layer between the barrier packaging material 13A and the first base plate 3 means that an air layer is not interposed between the barrier packaging material 13A and the first substrate 1 of the first base plate 3. An air layer has a significantly different refractive index to the barrier packaging material 13A and the first substrate 1. This results in large differences in refractive index at interfaces of a "barrier packaging material 13A/air layer/first substrate 1" layered structure. When there are large differences in refractive index at the interfaces, the amount of light that is reflected at these interfaces increases and, as a result, the efficiency with which incident light is utilized cannot be sufficiently improved. By filling between the barrier packaging material 13A and the first substrate 1 with an adhesive layer instead of an air layer, refractive index differences can be reduced, and loss due to interface reflection can be reduced. Moreover, suppression of light reflection can inhibit the occurrence of interference fringes at the solar cell module surface. It is more preferable that a material having a refractive index value that is between the refractive index values of the barrier packaging material 13A and the first substrate 1 is selected as a material forming the adhesive layer. A material such as described above may, for example, be selected from the materials listed as partition materials while taking into account the material of the barrier packaging material 13A and the material of the first substrate 1.

Moreover, particularly in a case in which the solar cell module is a dye-sensitized solar cell module, it is preferable that a material having high light transmittance in an absorption wavelength region of the used dye is selected as the material forming the adhesive layer.

Examples of fillers through which water vapor and gases do not easily pass include liquid and gel paraffin, silicone, phosphoric acid esters, and aliphatic esters.

The water vapor permeability of the barrier packaging materials 13A and 13B in an environment having a temperature of 40° C. and a relative humidity of 90% (90% RH) is preferably 0.1 g/m$^2$/day or less, more preferably 0.01 g/m$^2$/day or less, even more preferably 0.0005 g/m$^2$/day or less, and particularly preferably 0.0001 g/m$^2$/day or less.

The total luminous transmittance of the barrier packaging materials 13A and 13B is preferably 50% or more, more preferably 70% or more, and even more preferably 85% or more. The total luminous transmittance can be measured in accordance with JIS K7361-1, for example.

The barrier packaging materials 13A and 13B may each be a film or thin plate that includes a barrier layer having low water vapor and gas permeability on a plastic support. Examples of barrier films having low gas permeability include films obtained through vapor deposition of silicon oxide or aluminum oxide (JP S53-12953 B, JP S58-217344 A), films including an organic-inorganic hybrid coating layer (JP 2000-323273 A, JP 2004-25732 A), films containing an inorganic layered compound (JP 2001-205743 A), films in which inorganic materials are stacked (JP 2003-206361 A, JP 2006-263989 A), films in which organic and inorganic layers are alternately stacked (JP 2007-30387 A; U.S. Pat. No. 6,413,645 B1; Affinito et al., Thin Solid Films, 1996, pages 290 and 291), and films in which organic and inorganic layers are consecutively stacked (US 2004-46497 A).

Also, particularly in a case in which a frame-like shaped product 31 is shaped in a unified form with the barrier packaging material 13A or 13B, the barrier packaging material in the unified shaped product may be in the form of a film or a thin plate.

<Filling Member>

A filling member 30 is present in at least part of a gap between the barrier packaging material 13B and the periphery of the connected body of the plurality of cells (more specifically, a partition 8 of the plurality of cells in the example illustrated in FIG. 2) in the base plate surface direction. The filling member 30 is preferably disposed in contact with the periphery of the connected body in the gap. Moreover, the filling member 30 preferably occupies 90% or more, more preferably 95% or more, and even more preferably 99% or more of the total volume of the gap. This is because by restricting the volume occupied by gas in the gap, peeling at the seal 14 due to expansion of the gas upon a rise in temperature of the solar cell module can be inhibited. The filling member 30 may include a cured resin composition and/or a frame-like shaped product having an inner surface shape that at least partly extends along a side surface of the connected body of the plurality of cells. The frame-like shaped product may, for example, have a shape such as that of a frame-like shaped product 31 illustrated in FIG. 3. The inclusion of the frame-like shaped product 31 in the filling member makes it more difficult for bending to occur around the seal and is, therefore, expected to have an effect of suppressing generation of stress and increasing resistance of the barrier packaging materials 13A and 13B to peeling compared to a case in which the frame-like shaped product 31 is not included. Moreover, by matching the thickness of the frame-like shaped product 31 with the thickness of the solar cell module 100, ease of handling in a subsequent step, such as when combining the solar cell module with another member, can be improved because there is no step between a region in the solar cell module corresponding to the seal of the barrier packaging material and other regions in the solar cell module.

The filling member 30 is preferably unified with at least part of the seal 14. This is because when the filling member 30 is unified with at least part of the seal 14, airtightness of sealing of the solar cell module is improved, efficiency retention of the solar cell module is further improved, and processability is improved through unified shaping. Note that the phrase "the filling member is unified with at least part of the seal" as used in the present specification means that the filling member and at least part of the seal are formed from the same material and without a joint therebetween. For example, by forming the filling member 30 using the seal resin composition 15 when obtaining the structure illustrated in FIG. 2, it is possible to form a structure in which "the filling member is unified with at least part of the seal". Examples of other embodiments in which "the filling member is unified with at least part of the seal" include an embodiment illustrated in FIGS. 3 and 4. In this embodiment, a frame-like shaped product 31 that is a constituent of the filling member also functions as part of a seal that seals a gap between barrier packaging materials 13A and 13B. Another example of a structure in which "the filling member is unified with at least part of the seal" is a structure (not illustrated) in which a metal seal member is interposed between barrier packaging materials 13A and 13B and in which the metal seal member and the upper and lower barrier packaging materials 13A and 13B are adhered through a cured product of a seal resin composition having the same chemical composition as a filling member 30.

The frame-like shaped product 31 may be selected from various materials such as resins and metals, and also composite materials thereof, without any specific limitations. Examples of metal materials that may be used include aluminum, SUS, copper, titanium, and nickel. No specific limitations are placed on cured resin compositions that may be used to form the filling member 30 and resin compositions that may be used to form the frame-like shaped product 31, and any of the same resin compositions as previously described as the "seal resin composition" may be used. Note that even in a case in which the frame-like shaped product 31 is formed from the same material as the resin composition forming the filling member 30 or the seal resin composition, the presence of the frame-like shaped product 31 in the solar cell module 100 can be determined by a method in which a cross-section of the solar cell module 100 is observed and the presence of an adhesion interface between resins is observed by the naked eye or using a microscope, or by a method in which surface analysis of a cross-section is performed.

Moisture permeability of the frame-like shaped product is preferably suppressed to a greater extent than that of the seal of the barrier packaging material. Examples of methods by which moisture permeability may be suppressed include a method in which moisture permeability of the frame-like shaped product itself is reduced and a method in which a metal material layer or the like having low moisture permeability is formed on at least part of the surface of the frame-like shaped product. Although the distance between the barrier packaging materials 13A and 13B appears to increase in an embodiment in which the frame-like shaped product 31 functions as part of the seal, water permeation into the solar cell module 100 can be inhibited. Note that in a case in which a conductive material such as a metal is used for the frame-like shaped product, an insulating part is formed as appropriate by coating or the like at a location that is required to be electrically insulating when the frame-like shaped product is incorporated into the solar cell module.

Figure 3:
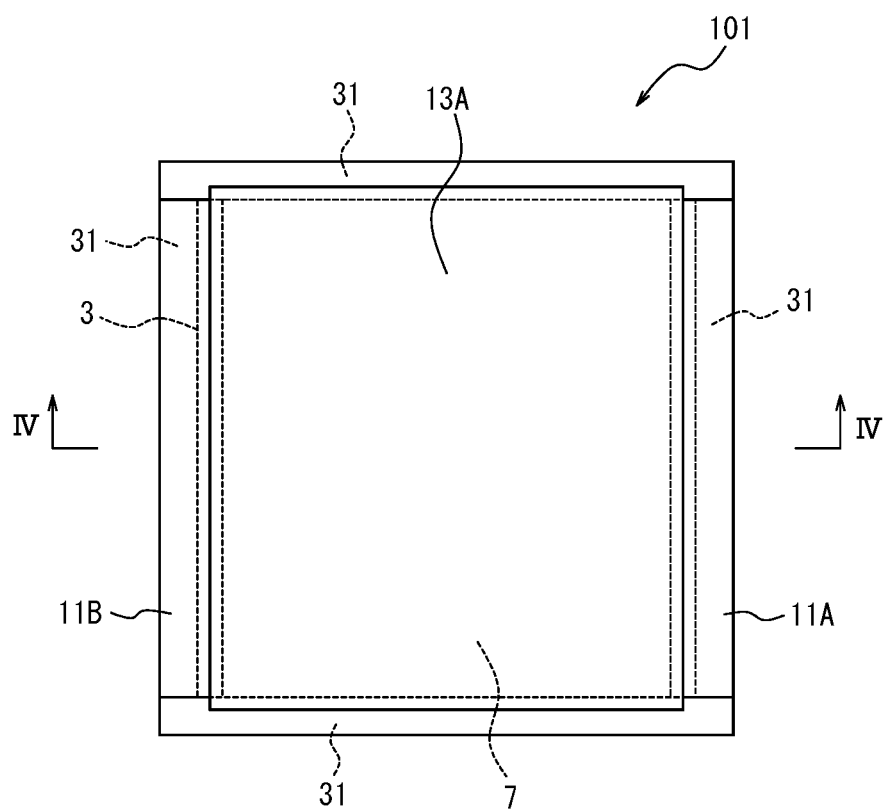
FIG. 3 is a plan view illustrating one example of schematic structure of a solar cell module according to another embodiment of the present disclosure.
Figure 4:
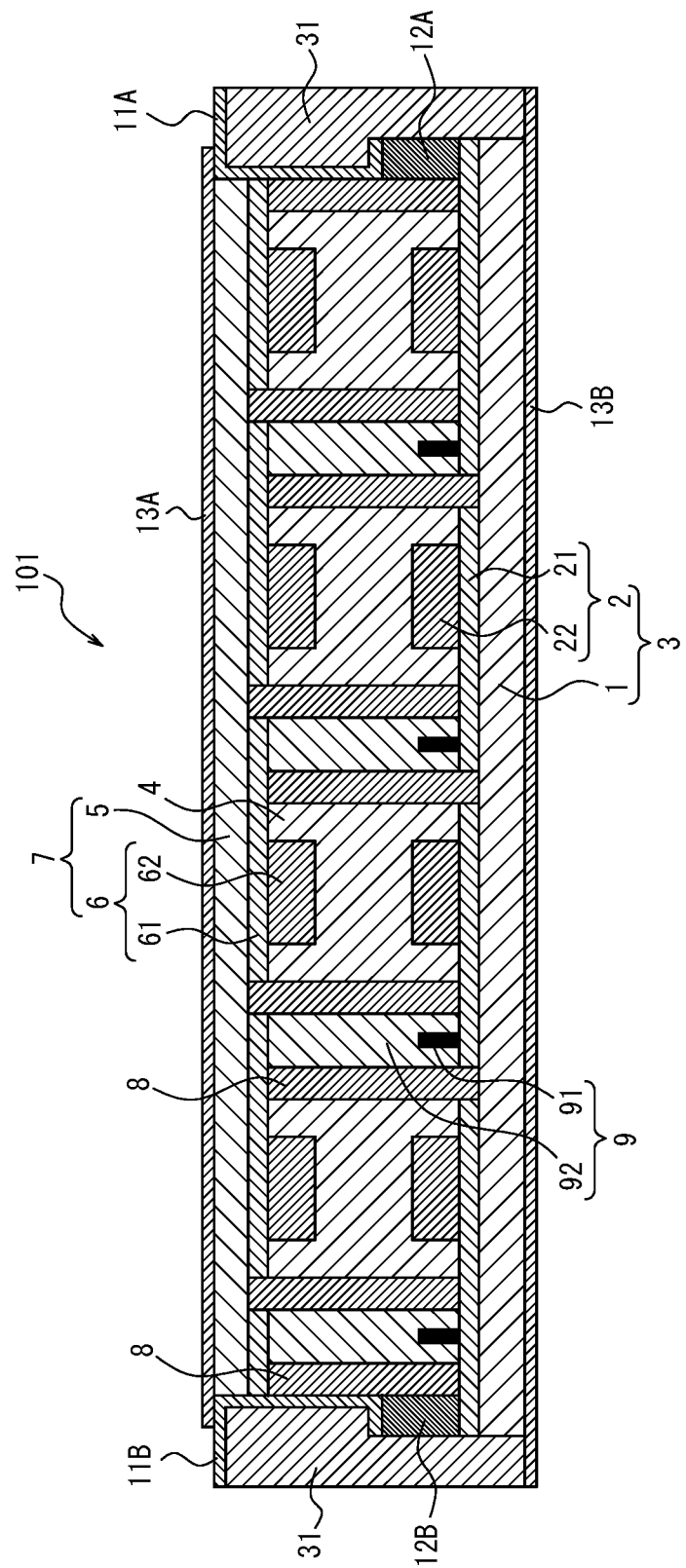
FIG. 4 is a cross-sectional view IV-IV illustrating one example of schematic structure of the solar cell module illustrated in FIG. 3.

The following provides a detailed description of another example of schematic structure of a solar cell module according to the present disclosure with reference to FIGS. 3 and 4. FIG. 3 is a plan view illustrating a solar cell module 101 in which a filling member 30 is formed by a frame-like shaped product 31, as viewed from a side of a second base plate 7. As is clear from FIG. 3, the frame-like shaped product 31 has a rectangular frame shape. The frame-like shaped product 31 includes two conductors that respectively function as a first lead-out electrode 11A and a second lead-out electrode 11B. Moreover, as illustrated in FIG. 3, at least part of the first lead-out electrode 11A and the second lead-out electrode 11B is adjacent to the second base plate 7 and is not covered by a barrier packaging material 13A at the upper surface of the solar cell module 101. In other words, the first lead-out electrode 11A and the second lead-out electrode 11B are exposed to outside of the solar cell module 101. Moreover, an inner surface shape of the frame-like shaped product 31 is a shape that extends along a side surface of a connected body of a plurality of cells as illustrated by the cross-sectional view in FIG. 4 that is taken along a line IV-IV in FIG. 3. More specifically, the inner surface shape of the frame-like shaped product 31 is a shape along the side surfaces of a first base plate 3, a first electrical connector 12A, the second base plate 7, a second electrical connector 12B, and two partitions 8 that form both ends of the connected body of the plurality of cells. A gap between the frame-like shaped product 31 and the connected body of the plurality of cells and/or a gap between the frame-like shaped product 31 and the first lead-out electrode 11A or second lead-out electrode 11B connected to the connected body of the plurality of cells may be filled by a cured resin composition (not illustrated). Moreover, a gap between the first lead-out electrode 11A or second lead-out electrode 11B and the connected body of the plurality of cells adjacent thereto may be filled by a cured resin composition (not illustrated). These resin compositions are not specifically limited and may be any of the same resin compositions as previously described as the "seal resin composition".

The frame-like shaped product 31 may be a unified shaped product that is partially unified with the barrier packaging material 13A or 13B. The phrase "the frame-like shaped product is unified with part of the barrier packaging material" as used in the present specification means that the barrier packaging material and the frame-like shaped product are formed from the same material and that a joint is not present therebetween. In this case, processability in a packaging step of the solar cell module 101 can be improved. Moreover, as a result of there not being a joint between the barrier packaging material 13A or 13B and the frame-like shaped product 31, tight sealing of the solar cell module 101 can be further improved, and efficiency retention of the solar cell module 101 can be further increased.

The first lead-out electrode 11A and the second lead-out electrode 11B may be conductors that are included in the frame-like shaped product 31 or may be conductive layers that are formed on the frame-like shaped product 31 through surface treatment using a conductive material. In this situation, surface treatment by a dry process such as vapor deposition or surface treatment by a wet process such as plating may be adopted as the method of surface treatment as appropriate. The conductive material used in the surface treatment may be a typical metal material or alloy material such as previously described as materials for forming conductors of lead-out electrodes. When the frame-like shaped product 31 includes conductive layers formed through surface treatment, tight sealing and efficiency retention of the obtained solar cell module can be further improved.

In a case in which the frame-like shaped product is formed from a resin material, the conductors are not limited to being disposed at the surface of the frame-like shaped product 31 and may alternatively be formed inside the frame-like shaped product 31. In this case, conductors that pass internally through the frame-like shaped product 31 may be formed by, for example, preparing penetrations in the frame-like shaped product 31 in advance and then filling these penetrations with solder, a conductive resin, or the like.

Moreover, in a case in which the frame-like shaped product 31 is formed from a conductive material, the surface of the frame-like shaped product 31 may be coated by an insulating resin or the like, and partially exposed conductive surfaces may serve as the first lead-out electrode 11A and the second lead-out electrode 11B.

(Production Method of Solar Cell Module)

The solar cell module 100 having the configuration set forth above can be produced by the following procedure, for example, but is not specifically limited to being produced in this manner. Specifically, a first base plate 3 including photoelectrodes 2 is first produced, and then wiring 91 is formed on the produced first base plate 3. Next, an uncured conductive resin composition 92 is applied at positions overlapping with the wiring 91, and then a partition material is applied such as to sandwich the applied conductive resin composition 92 and surround each photoelectrode conductive layer 21. A constituent component of electrolyte layers 4, such as an electrolyte solution, is then used to fill regions where the partition material has been applied. Thereafter, a second base plate 7 including counter electrodes 6 is overlapped with the first base plate 3. The uncured conductive resin composition 92 is cured to form cell connectors 9 and strongly adhere the first base plate 3 and the second base plate 7 to thereby obtain a connected body of a plurality of cells including a pair of electrode base plates.

A first lead-out electrode 11A and a second lead-out electrode 11B are respectively adhered to a photoelectrode 2 and a counter electrode 6 included in the obtained connected body of the plurality of cells via a conductive adhesive (lead-out electrode attachment step). A resin composition is applied to a barrier packaging material 13B such as to fill a gap between the barrier packaging material 13B and the periphery of the connected body in a surface direction (application step). The connected body with the attached lead-out electrodes 11A and 11B is positioned on the barrier packaging material 13B with the second substrate 5 facing downward, a resin composition is applied onto the barrier packaging material 13B and the connected body, and another barrier packaging material 13A is stacked thereon. For example, a structure in which the connected body with the attached lead-out electrodes 11A and 11B is interposed between the barrier packaging materials 13A and 13B may be sandwiched from the upper and lower surfaces thereof using a pair of upper and lower pressing members having a protruding surface made from a rubber material (sandwiching step). In this manner, the barrier packaging materials 13A and 13B and the connected body can be closely adhered through the resin composition, and a solar cell module 100 having the structure described with reference to FIGS. 1 and 2 can be obtained.

In production of the solar cell module 101 having the structure described with reference to FIGS. 3 and 4, a frame-like shaped product 31 is first prepared. The frame-like shaped product 31 may include a conductive layer formed through surface treatment using a conductive material. The frame-like shaped product 31 may be formed by causing a resin composition such as previously described to flow into a mold having the desired shape, and then curing the resin composition. Lead-out electrodes 11A and 11B are attached to the obtained frame-like shaped product 31 via a resin composition. The solar cell module 101 having the structure described with reference to FIGS. 3 and 4 can then be obtained by closely adhering the frame-like shaped product 31, the lead-out electrodes 11A/11B, and barrier packaging materials 13A and 13B via a resin composition.

EXAMPLES

The following provides a more specific description of the present disclosure based on examples. However, the present disclosure is not limited to the following examples. In the following description, "%" used to express a quantity is by mass, unless otherwise specified.

In the examples and comparative example, the occurrence of peeling at a seal and the efficiency retention of a solar cell module were measured by the following methods.

<Occurrence of Peeling at Seal>
A solar cell module obtained in each example or comparative example was visually inspected and the occurrence of barrier film peeling at a seal was evaluated by the following standard.
Peeling: Peeling occurs at end of seal
No peeling: No peeling for 90% or more of sealing width along entire perimeter of seal <Efficiency Retention of Solar Cell Module>
A solar cell module produced in each example or comparative example was connected to a SourceMeter (Model 2400 SourceMeter produced by Keithley Instruments, Inc.). A solar simulator (PEC-L11 produced by Peccell Technologies, Inc.) having an AM1.5G filter attached to a 150 W xenon lamp illumination device was used as an illuminant. The illuminant was adjusted to an intensity of 1 sun (approximately 100,000 lux AM1.5G, 100 mWcm$^{-2}$ (Class A of JIS C 8912)) and was used to irradiate the solar cell module. The output current of the solar cell module was measured under 1 sun photoirradiation while changing the bias voltage from 0 V to 0.8 V in units of 0.01 V to acquire a current-voltage characteristic. Measurement was performed in the same manner while stepping the bias voltage from 0.8 V to 0 V in the reverse direction. Average values for measurements in the forward and reverse directions were taken as photocurrent data. The initial photoelectric conversion efficiency (%) was calculated from the current-voltage characteristic and photocurrent data obtained in this manner.

Next, the dye-sensitized solar cell module was held for 300 hours in an environment of 65° C. and 90% RH, and then a current-voltage characteristic of the solar cell module was measured in the same way as described above. The conversion efficiency was determined in the same way as above, and efficiency retention relative to the initial value was calculated by the following formula.

$$\text{Efficiency retention (\%)} = [\text{Conversion efficiency after holding at 65° C. and 90\% RH}]/[\text{Initial conversion efficiency}] \times 100$$

Example 1

<Preparation of Dye Solution>
A 200 mL volumetric flask was charged with 72 mg of a ruthenium complex dye (N719 produced by Solaronix). Mixing and agitation with 190 mL of dehydrated ethanol was then performed. The volumetric flask was stoppered and then subjected to 60 minutes of agitation through vibration by an ultrasonic cleaner. The solution was held at normal temperature and then dehydrated ethanol was added to adjust the total volume to 200 mL and thereby obtain a dye solution.

<Production of Photoelectrode Base Plate>
A transparent conductive base plate (sheet resistance: 13 ohm/sq.) obtained by coating a transparent base plate (polyethylene naphthalate film of 200 μm in thickness) serving as a photoelectrode substrate with a transparent conductive layer (indium tin oxide (ITO)) serving as a photoelectrode conductive layer was subjected to screen printing to print conductive silver paste (K3105 produced by Pelnox Limited) serving as wiring (current collector wiring) at intervals in accordance with photoelectrode cell width. Heating and drying were then performed for 15 minutes in a 150° C. hot air circulation oven to produce wiring. The transparent conductive base plate including the obtained wiring was set in a coater with the wiring formation surface thereof facing upward, and a wire bar was used to apply an ORGATIX PC-600 solution (produced by Matsumoto Fine Chemical Co., Ltd.) that had been diluted to 1.6% at a sweep rate of 10 mm/s. The obtained coating was dried for 10 minutes at room temperature and was then further heated and dried for 10 minutes at 150° C. to produce an undercoat layer on the transparent conductive base plate.

Laser processing was performed with respect to the undercoat layer formation surface of the transparent conductive base plate at intervals in accordance with the photoelectrode cell width to form insulated wiring.

In addition, openings (length: 60 mm; width: 5 mm) for porous semiconductor fine particulate layer formation were punched in a mask film obtained through two-stage stacking of protective films each having a pressure-sensitive adhesive layer coated on polyester film (lower stage: PC-542PA produced by Fujimori Kogyo Co., Ltd.; upper stage: NBO-0424 produced by Fujimori Kogyo Co., Ltd.). The processed mask film was pasted to the current collector wiring formation surface of the transparent conductive base plate on which the undercoat layer had been formed such that air bubbles did not enter therebetween. Note that the aim of the first layer of the mask film was to prevent adhesion of dye at unnecessary locations and the aim of the second layer of the mask film was to prevent adhesion of porous semiconductor fine particles at unnecessary locations.

A high-pressure mercury lamp (rated lamp power: 400 W) illuminant was positioned at a distance of 10 cm from the mask pasting surface. Straight after 1 minute of irradiation with electromagnetic waves, titanium oxide paste (PECC-C01-06 produced by Peccell Technologies, Inc.) was applied using a Baker-type applicator. The paste was dried for 10 minutes at normal temperature and then the upper protective film (NBO-0424 produced by Fujimori Kogyo Co., Ltd.) of the mask film was removed by peeling. Heating and drying were performed for 5 minutes in a 150° C. hot air circulation oven to form porous semiconductor fine particulate layers (length: 60 mm; width: 5 mm).

Thereafter, the transparent conductive base plate on which the porous semiconductor fine particulate layers (length: 60 mm; width: 5 mm) had been formed was immersed in the prepared dye solution (40° C.) and adsorption of dye was carried out under gentle agitation. After 90 minutes had passed, the titanium oxide films to which the dye had adsorbed were removed from the dye adsorption vessel, were washed with ethanol, and were dried, and then remaining mask film was removed by peeling to thereby produce photoelectrodes.

<Production of Counter Electrode Base Plate>

The conductive surface of a transparent conductive base plate (sheet resistance: 13 ohm/sq.) obtained by coating a transparent base plate (polyethylene naphthalate film of 200 μm in thickness) serving as a counter electrode substrate with a transparent conductive layer (indium tin oxide (ITO)) serving as a counter electrode conductive layer was subjected to laser processing at intervals in accordance with platinum film pattern width to form insulated wiring. Next, a metal mask in which openings (length: 60 mm; width: 5 mm) had been punched was overlapped, and sputtering was performed to form six platinum film patterns (catalyst layers) and thereby obtain a counter electrode base plate having light transmittance of approximately 72% in catalyst layer formation parts thereof. Note that the porous semiconductor fine particulate layers and the catalyst layers had structures that matched when the photoelectrode base plate and the counter electrode base plate were overlapped with the conductive surfaces thereof facing one another.

<Production of Dye-Sensitized Solar Cell Module>

A conductive resin composition was prepared by adding Micropearl AU (particle diameter: 8 μm) produced by Sekisui Jushi Corporation to TB3035B as an acrylic resin serving as a resin material of the conductive resin composition such that the amount of Micropearl AU was 3 mass %, and then performing uniform mixing using a planetary centrifugal mixer.

The counter electrode base plate was secured to a suction plate made from aluminum using a vacuum pump with the catalyst layer formation surface of the counter electrode base plate as a front surface. Next, a dispensing device was used to apply the conductive resin composition between the catalyst layers as lines at positions that, when in opposition with the photoelectrode base plate, overlapped with the wiring between the photoelectrode cells, and to apply a liquid ultraviolet curable sealant "TB3035B" (produced by ThreeBond Holdings Co., Ltd.; absorption wavelength: 200 nm to 420 nm) as a partition material at the periphery of the catalyst layers such as to sandwich these lines therebetween. Thereafter, a specific amount of electrolyte solution was applied to catalyst layer parts and then an automatic pasting apparatus was used to perform stacking in a reduced pressure environment such as to obtain a structure in which rectangular catalyst layers and similarly shaped porous semiconductor fine particulate layers faced one another. Photoirradiation with a metal halide lamp was performed from the photoelectrode base plate side and then photoirradiation was also performed from the counter electrode base plate side. Thereafter, a plurality of connected bodies disposed in the pasted base plates were each cut out. Conductive copper foil tape (CU7636D produced by Sony Chemical and Information Device Corporation; thickness of copper foil (conductor): 35 μm) for forming lead-out electrodes was attached to wiring disposed at both ends (lead-out electrode parts) of the connected body. The surface of the conductive copper foil tape used in this example was precoated with a conductive pressure-sensitive adhesive formed from a conductive acrylic resin. Consequently, the electrical connectors interposed between the photoelectrode/counter electrode and lead-out electrodes were each formed by the conductive pressure-sensitive adhesive coated on the conductors forming the lead-out electrodes. Moreover, the conductive copper foil tape used to form each of the lead-out electrodes was tape from which the conductive pressure-sensitive adhesive coating had been removed prior to attachment with the exception of coating in a region that was to be used for attachment to the photoelectrode/counter electrode (i.e., a region for forming an electrical connector).

Next, two barrier films (Ultra-High Barrier Film produced by Neo Seeds Co., Ltd.; water vapor permeability: 0.00005 $g/m^2/day$) serving as a barrier packaging material that were each larger than the connected body were prepared. One of the barrier films was secured to an aluminum suction plate using a vacuum pump, and a resin composition (TB3035B produced by ThreeBond Holdings Co., Ltd.; ultraviolet curable acrylic resin) for formation of a filling member was applied at positions that would overlap with wiring at lead-out electrode parts when the connected body was stacked with the counter electrode side thereof facing downward. Consequently, the surface of the connected body at the counter electrode side and the barrier film were not adhered.

The connected body was then stacked thereon with the conductive copper foil tape extending outside of the barrier film, and photoirradiation was performed from the barrier film side. A liquid resin composition (TB3035B produced by ThreeBond Holdings Co., Ltd.; ultraviolet curable acrylic resin) serving as a resin composition for forming a seal was applied onto the entire surface of the connected body, the barrier film at the periphery of the connected body, inclusive of a front surface of the conductive copper foil tape (coating removed), and a rear surface of the conductive copper foil tape at the periphery.

The dye-sensitized solar cell module with the barrier film was placed on a lower member of a pair of upper and lower pressing members that was a jig having a protruding surface made of a rubber material that protruded at sections coming into contact with around the periphery of the photoelectrode base plate and the counter electrode base plate. Next, the other barrier film and the upper member of the pressing members were stacked from above, the connected body was pressed in the thickness direction, and then photoirradiation was performed to obtain a dye-sensitized solar cell module that was packaged in the barrier films and had the lead-out electrodes extending from the side of the module.

Efficiency retention of the obtained solar cell module as measured by the previously described method was 95%.

Example 2

A dye solution preparation step and a photoelectrode base plate production step were implemented in the same way as in Example 1. In a solar cell module production step, a connected body was formed and cut out in the same way as in Example 1, and then a solar cell module was formed by carrying out subsequent steps as described below.

Note that in the present example, a frame-like shaped product made of resin and having an inner surface shape designed to at least partly extend along a side surface of the connected body of a plurality of cells (for example, the frame-like shaped product 31 illustrated in FIGS. 3 and 4) was prepared as a filling member in advance of other steps. The frame-like shaped product was a resin shaped product having light transmittivity and was formed using a resin composition (ZEONEX produced by Zeon Corporation).

Moreover, in the solar cell module production step described in Example 1, a step of attaching copper foil tape to wiring disposed at both ends of the connected body was omitted. In place of this step in the present example, a resin composition (TB3035B produced by ThreeBond Holdings Co., Ltd.; ultraviolet curable acrylic resin) was applied in regions at the bottom of the frame-like shaped product where lead-out electrodes were to extend. Copper foils were then attached to surfaces were application had been performed at the bottom of the frame-like shaped product, photoirradiation was performed from the frame-like shaped product side, and the resin composition was cured to adhere to the frame-like shaped product and the copper foils. In addition, the same resin composition as was applied at the bottom of the frame-like shaped product was also applied in regions of an inner side surface of the frame-like shaped product where the lead-out electrodes were to extend. A part of each of the copper foils other than that adhered to the bottom was bent along the shape of the frame-like shaped product, photoirradiation was performed from the frame-like shaped product side, and the resin composition was cured to adhere the frame-like shaped product and the copper foils.

Conductive paste DOTITE® (DOTITE is a registered trademark in Japan, other countries, or both; DOTITE D-362 produced by Fujikura Kasei Co., Ltd.) was applied at positions overlapping with wiring at ends of the connected body and a resin composition (TB3035B produced by ThreeBond Holdings Co., Ltd.; ultraviolet curable acrylic resin) was applied at a part where a side surface of the connected body and an inner surface of the frame-like shaped product come into contact. The connected body was fitted into an inner border part of the frame-like shaped product, the DOTITE was solidified at room temperature, and photoirradiation was performed from the frame-like shaped product side to cure the resin composition and thereby obtain a fitted body of the connected body and the frame-like shaped product. Next, in the dye-sensitized solar cell module production step, a barrier film (Ultra-High Barrier Film produced by Neo Seeds Co., Ltd.; water vapor permeability: 0.00005 $g/m^2/day$) serving as a barrier packaging material that was smaller than an outer border of the frame-like shaped product was secured to an aluminum suction plate, and a resin composition (TB3035B produced by ThreeBond Holdings Co., Ltd.; ultraviolet curable acrylic resin) was applied onto the entire surface thereof. The bottom surface of the fitted body having the copper foils was stacked from above, and then photoirradiation was performed from the barrier film side to achieve sealing. Note that because part of each of the copper foils on the bottom surface of the fitted body was left exposed to outside of the solar cell module through this operation, the copper foils were able to function as lead-out electrodes. A barrier film serving as a barrier packaging material having a size at least sufficient to cover the entire upper surface of the fitted body was adhered to the surface at the opposite side of the solar cell module via the same resin composition to obtain a dye-sensitized solar cell module having lead-out electrodes exposed at the bottom surface of the module.

Efficiency retention of the obtained solar cell module as measured by the previously described method was 94%.

Example 3

The same type of frame-like shaped product made from resin as in Example 2 was used. The frame-like shaped product was masked in a manner such that regions where the copper foils were attached in Example 2 were exposed, and the exposed surfaces were subjected to vapor deposition of titanium (conductive material). A dye-sensitized solar cell module having lead-out electrodes exposed at the bottom surface of the module was produced in the same way as in Example 2, but using the frame-like shaped product equipped with conductive layers that was formed in this manner.

Therefore, steps were carried out in the same way as in Example 2 with the exception of the step of attaching the copper foils to the frame-like shaped product. Efficiency retention of the obtained solar cell module as measured by the previously described method was 97%.

Example 4

In place of the frame-like shaped product formed from a resin composition in Example 2, a frame-like shaped product made from aluminum that had the same shape as the frame-like shaped product in Example 2 was prepared by machining, and the entire surface of the frame-like shaped product was subjected to electrical insulation coating with high-density polyethylene. Copper foils were attached to the prepared frame-like shaped product in the same way and in the same regions as the copper foils attached in Example 2. However, a delayed curing adhesive was used instead of TB3035B as a resin composition, the copper foils were positioned after application of the adhesive, and heating was performed in a 100° C. oven. A fitted body of a connected body and the frame-like shaped product was also prepared in the same way as in Example 2. However, a delayed curing adhesive was used instead of TB3035B as a resin composition, fitting was carried out after application of the adhesive, and then heating was performed in a 60° C. oven. A dye-sensitized solar cell module having lead-out electrodes exposed at the bottom surface of the module was produced in the same way as in Example 2 with the exception of the points described above. Efficiency retention of the obtained solar cell module as measured by the previously described method was 99%.

Example 5

Figure 5:
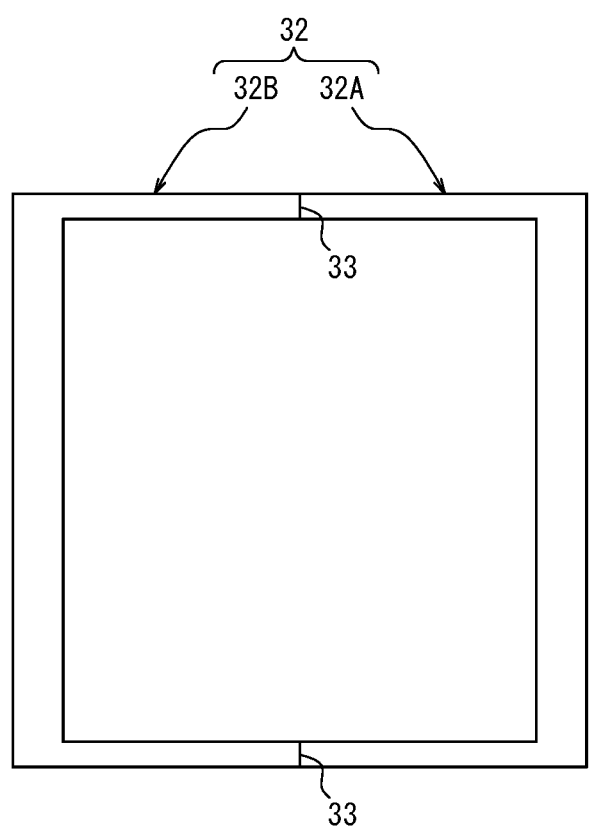
FIG. 5 is a plan view illustrating one example of schematic structure of a frame-like shaped product that may be included in the presently disclosed solar cell module.

A pair of frame-like shaped products 32 made from aluminum and having a shape such as illustrated in FIG. 5 was prepared by machining. The frame-like shaped products 32 included a first frame-like shaped product unit 32A and a second frame-like shaped product unit 32B. The first frame-like shaped product unit 32A and the second frame-like shaped product unit 32B were designed to have the same shape as the frame-like shaped product in Example 2 when joined together. In other words, the pair of frame-like shaped products 32 had a shape equivalent to that obtained if the frame-like shaped product in Example 2 is divided into two parts with the first and second lead-out electrodes taken as left and right sides. Joining surfaces 33 of the first frame-like shaped product unit 32A and the second frame-like shaped product unit 32B were subjected to electrical insulation coating with high-density polyethylene resin. A delayed curing adhesive was applied onto the resin-coated joining surface 33 of the first frame-like shaped product unit 32A or the second frame-like shaped product unit 32B. Photoirradiation was performed and then the unit to which the adhesive had been applied was joined to the other unit. Heating was performed in a 100° C. oven to prepare a conductive surface-exposed frame-like shaped product 32 having aluminum forming a conductive surface exposed at the surface thereof. A dye-sensitized solar cell module having lead-out electrodes exposed at the bottom surface of the module was produced in the same way as in Example 4, but using the conductive surface-exposed frame-like shaped product 32 that was formed in this manner. Efficiency retention of the obtained solar cell module as measured by the previously described method was 98%.

Comparative Example 1

A dye-sensitized solar cell module having lead-out electrodes extending from the side of the module was produced in the same way as in Example 1 with the exception that in the solar cell module production step, the connected body was stacked with the counter electrode side facing downward without applying a resin composition for formation of a filling member onto the barrier film secured on the aluminum suction plate.

The presence of a space between the lead-out electrodes and the barrier film in the obtained dye-sensitized solar cell module was visually confirmed. Efficiency retention of the obtained solar cell module as measured by the previously described method was 32%.

TABLE 1

| | Conditions | | | Evaluation | |
| --- | --- | --- | --- | --- | --- |
| | Gap filling | Lead-out electrodes | Lead-out part | Visual | Efficiency retention [%] |
| Example 1 | Resin | Copper foil | Side | No peeling | 95 |
| Example 2 | Resin frame-like shaped product | Copper foil | Bottom surface | No peeling | 94 |
| Example 3 | Resin frame-like shaped product | Vapor deposition film | Bottom surface | No peeling | 97 |
| Example 4 | Metal frame-like shaped product | Copper foil | Bottom surface | No peeling | 99 |
| Example 5 | Metal frame-like shaped product | Conductive layer | Bottom surface | No peeling | 98 |
| Comparative Example 1 | None | Copper foil | Side | Peeling | 32 |

As is clear from Table 1, Examples 1 to 5 demonstrate that a solar cell module in which a filling member is present in at least part of a base plate surface direction gap between a barrier packaging material and a periphery of a connected body has an excellent photoelectric conversion efficiency retention rate. Moreover, Comparative Example 1 demonstrates that a solar cell module in which a filling member is not present in this gap has a poor photoelectric conversion efficiency retention rate.

INDUSTRIAL APPLICABILITY

According to the present disclosure, it is possible to provide a solar cell module that includes a barrier packaging material protecting the solar cell module from the external environment and that has an excellent photoelectric conversion efficiency retention rate.

REFERENCE SIGNS LIST 1 first substrate
2 photoelectrode
3 first base plate
4 electrolyte layer
5 second substrate
6 counter electrode
7 second base plate
8 partition
9 cell connector
11A first lead-out electrode
11B second lead-out electrode
12A first electrical connector
12B second electrical connector
13A, 13B barrier packaging material
14 seal
15 cured seal resin composition
21 photoelectrode conductive layer
22 porous semiconductor fine particulate layer
30 filling member
31 frame-like shaped product
32 conductive surface-exposed frame-like shaped product
61 counter electrode conductive layer
62 catalyst layer
91 wiring
92 conductive resin composition
100, 101 solar cell module

The invention claimed is:

1. A solar cell module comprising:
    a connected body including one or more photoelectric conversion cells in which a first electrode at a side of a first base plate and a second electrode at a side of a second base plate are in opposition via a functional layer;
    at least one barrier packaging material that is sealed by a seal and encloses the connected body;
    a first lead-out electrode connected to the first electrode via a first electrical connector; and
    a second lead-out electrode connected to the second electrode via a second electrical connector, wherein
    the solar cell module includes a filling member in at least in part of a gap between the barrier packaging material and a periphery of the connected body in a base plate surface direction that includes a surface direction of the first base plate and a surface direction of the second base plate, and
    at least part of the seal and the filling member are formed from the same material and a joint is not present therebetween.

2. The solar cell module according to claim 1, wherein the filling member includes a cured resin composition.

3. The solar cell module according to claim 1, wherein the filling member includes a frame-like shaped product having an inner surface shape that at least partly extends along a side surface of the connected body.

4. The solar cell module according to claim 3, wherein the frame-like shaped product and part of the barrier packaging material are formed from the same material and a joint is not present therebetween.

5. The solar cell module according to claim 3, wherein
    the frame-like shaped product includes at least one conductor or partial conductive layer that functions as the first lead-out electrode or the second lead-out electrode, and
    at least part of the conductor or partial conductive layer is not covered by the barrier packaging material.

6. The solar cell module according to claim 5, wherein the conductive layer is a conductive layer that is formed on the frame-like shaped product through surface treatment using a conductive material.

7. The solar cell module according to claim 1, further comprising an adhesive layer disposed in at least part of a gap between the barrier packaging material and either or both of the first base plate and the second base plate.

8. The solar cell module according to claim 1, wherein the functional layer is an electrolyte layer and the solar cell module is a dye-sensitized solar cell module.

* * * * *